(12) United States Patent
Vernon et al.

(10) Patent No.: US 7,282,306 B2
(45) Date of Patent: Oct. 16, 2007

(54) CONTINUOUS SLOPED PHASE EDGE ARCHITECTURE FABRICATION TECHNIQUE USING ELECTRON OR OPTICAL BEAM BLUR FOR SINGLE PHASE SHIFT MASK RET

(75) Inventors: Matt F. Vernon, Los Gatos, CA (US); Wen-Hao Cheng, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 446 days.

(21) Appl. No.: 10/808,063

(22) Filed: Mar. 26, 2004

(65) Prior Publication Data

US 2005/0214652 A1    Sep. 29, 2005

(51) Int. Cl.
    *G03F 1/00*    (2006.01)
(52) U.S. Cl. .................................... 430/5
(58) Field of Classification Search ............ 430/5, 430/30, 394
    See application file for complete search history.

(56) References Cited

U.S. PATENT DOCUMENTS 5,300,377 A *  4/1994  Keum ................ 430/5
6,228,745 B1 *  5/2001  Wheeler et al. ............ 438/424
6,436,590 B2    8/2002  Wang et al.
6,534,225 B2 *  3/2003  Flanders et al. ................ 430/5
6,780,568 B1 *  8/2004  Nistler et al. ................ 430/311

OTHER PUBLICATIONS

Wang et al., "Polarized Phase Shift Mask: Concept, Design, and Potential Advantages to Photolithography Process and Physical Design", Proceedings of the SPIE; The International Society for Optical Engineering Conference; vol. 4562, pp. 406-417, 2002.
Pfau et al., "Gradient Phase-Shifter Transitions Fabricated by Ion Milling", SPIE, vol. 1674 Optical/Laser Microlithography V, pp. 585-593, 1992.

* cited by examiner

*Primary Examiner*—S. Rosasco
(74) *Attorney, Agent, or Firm*—Fish & Richardson P.C.

(57) ABSTRACT

A phase shift mask may include boundaries between phase shift regions with continuous sloped phase edges. The continuous sloped phase edges may be produced by introducing a predetermined degree of defocus into a beam used during production of the mask to image the pattern on the mask. Such a phase shift mask may be "trimless", i.e., not require a corresponding binary "trim" mask for a second exposure to remove phase conflicts after exposure with the phase shift mask.

18 Claims, 4 Drawing Sheets

CONTINUOUS SLOPED PHASE EDGE ARCHITECTURE FABRICATION TECHNIQUE USING ELECTRON OR OPTICAL BEAM BLUR FOR SINGLE PHASE SHIFT MASK RET

BACKGROUND

A phase shift mask (PSM) may include alternating clear regions (which may be designated as zero (0) and pi ($\pi$) regions) with different step heights. The different step heights cause the light to be phase-shifted 180° between the two regions. As a consequence, the light from the clear zero region interferes destructively with the light diffracted from the adjacent pi region, causing an unexposed (dark) area on the photoresist layer.

"Phase conflict" is a potential problem in PSM technology. Phase conflict arises from unintentionally joining two regions that transmit light with opposite phases. Destructive interference of the light from these two regions may create artificial features on the wafer (e.g., unwanted lines).

Phase conflict may be avoided by using a double exposure/two mask method. In a first exposure, a PSM is used to image a pattern, which may include undesired features caused by phase conflict. In a second exposure, a binary (e.g., chrome-on-glass) "trim" mask is used to clear the undesired features. However, the addition of the second (trim mask) exposure may introduce overlay errors, reduce flexibility of physical design, and increase cycle time, labor, and production costs. These problems may worsen as the process margins of photolithography decrease and the pattern densities of integrated circuits increase.

DETAILED DESCRIPTION

Figure 1:
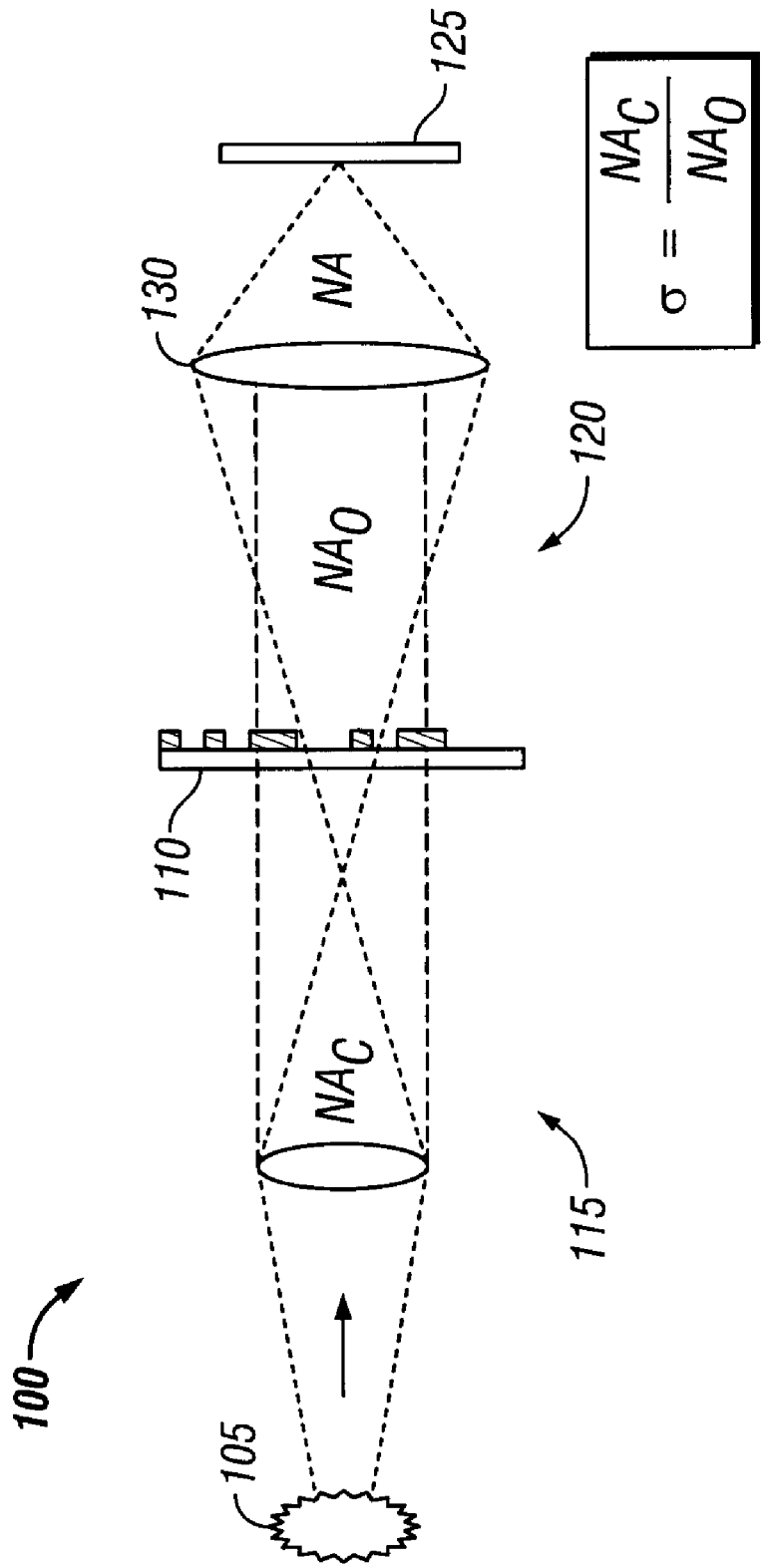
FIG. 1 is a block diagram of a photolithography system.

FIG. 1 shows an optical lithography system 100. Light from an illumination source 105 is transferred to a patterned mask 110 by an illumination system 115. Light passes through the mask and into the entrance pupil of an imaging system 120. The resulting pattern is imaged onto a photoresist covered wafer 125 by a lens 130 in the imaging system.

The mask 110 may be a phase shift mask (PSM). The quality of an imaged pattern produced with a typical binary mask may be degraded by light from clear areas on the mask diffracting into regions that ideally would be completely dark. The nominally dark region may have light diffracted into it from the adjacent nominally bright regions. A PSM may be used to reduce such diffraction and improve image contrast on the wafer.

Figure 2:
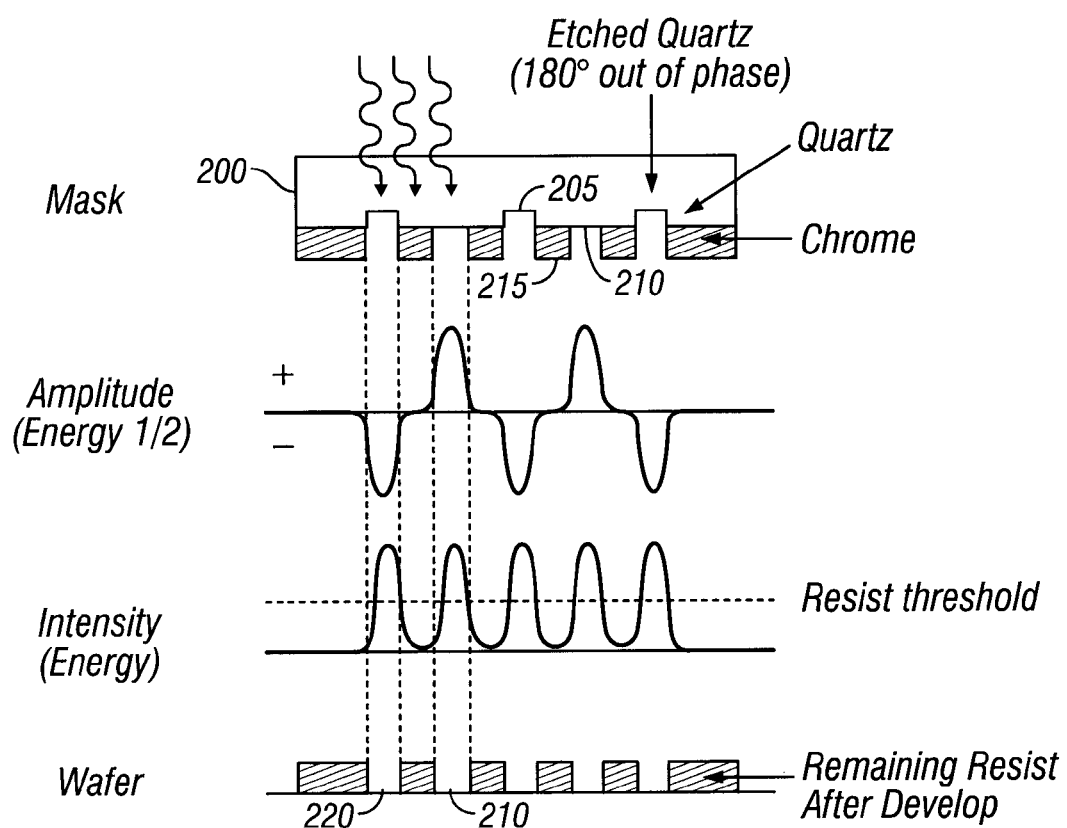
FIG. 2 is a sectional view of a phase shift mask (PSM).

FIG. 2 shows an exemplary PSM 200. In the PSM, alternating clear regions (which may be designated as zero (0) regions 210 and pi ($\pi$) regions 205) may have different step heights which cause the light to be phase-shifted 180° (90°/270° phase steps may also be used). As a consequence, the light from the clear zero region interferes destructively with the light diffracted from the adjacent pi region, causing an unexposed (dark) area on the photoresist layer. This may improve image contrast on the wafer.

PSMs may be fabricated using photolithography techniques. A glass substrate is coated with a layer of photoresist material. The photoresist may be exposed with a pattern on a mask to define phase shifted regions in the glass substrate. Depending on the tone of the photoresist (i.e., positive or negative), the exposed areas of the photoresist will be made either be more soluble (positive) or less soluble (negative). The more soluble areas of the photoresist are then removed in a development process, leaving portions of the substrate exposed. The exposed surfaces (and the remaining resist) may then be etched to form features with step heights corresponding to a phase shift at the wavelength used for the lithography tool in which the mask will be used (e.g., 193 nm).

"Phase conflict" is a potential problem in PSM technology. Phase conflict arises from unintentionally joining two regions that transmit light with opposite phases. Destructive interference of the light from these two regions may create artificial features on wafer (e.g., unwanted lines).

Phase conflict may be avoided by using a double exposure/two mask technique. In a first exposure, a PSM is used to image a pattern, which may include undesired features caused by phase conflict. In a second exposure, a binary (e.g., chrome-on-glass) "trim" mask is used to clear the undesired features. However, the addition of the second (trim mask) exposure may introduce overlay errors, reduce flexibility of physical design, and increase cycle time, labor, and production costs.

Figure 3A:
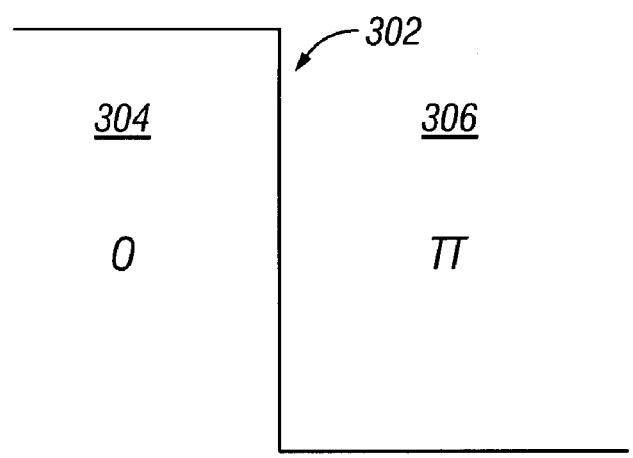
FIG. 3A is a sectional view of a PSM having an abrupt boundary between two phase shift regions.
Figure 3B:
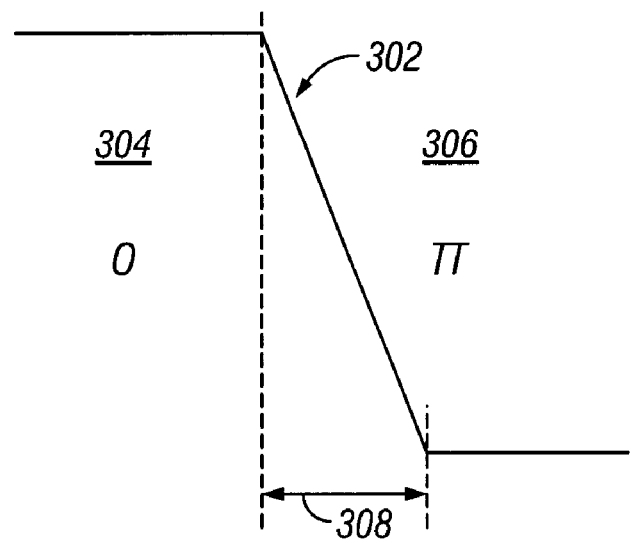
FIG. 3B is a sectional view of a PSM having a sloped boundary between two phase shift regions.

Phase conflict may be caused by the abruptness in the boundary (step) 302 between two adjacent phase shift regions 304 (0), 306 ($\Pi$), as shown in FIG. 3A. In an embodiment, phase conflict may be avoided by lengthening a lateral distance 308 over which the phase transition occurs to form a continuous sloped phase edge between adjacent phase shift regions, as shown in FIG. 3B. The gradual transition may prevent unwanted features from printing at the boundaries between phase shift regions. The lateral distance of the boundary may be on the order of the wavelength of light used in the lithography tool in which the mask will be used (e.g., order of $10^2$ nm).

A continuous sloped phase edge between phase shift regions may be produced during the fabrication of the PSM using a "controlled blur" imaging technique. The imaging system used for mask lithography (e.g., optical or electron beam) may include a defocus control to control the amount of defocus at the imaging plane. The imaging system may be operated in a deliberate "out-of-focus" condition, creating a sloped dose gradient in the exposed resist at the boundary between exposed and unexposed regions.

Figure 4A:
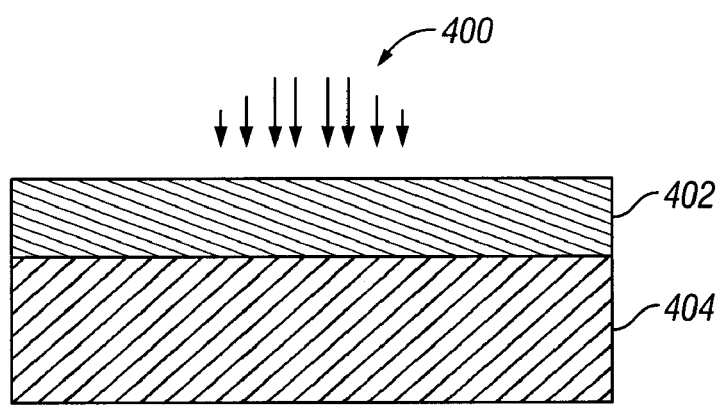
FIGS. 4A-4D show a process flow for producing a PSM including a sloped phase edge architecture.
Figure 4B:
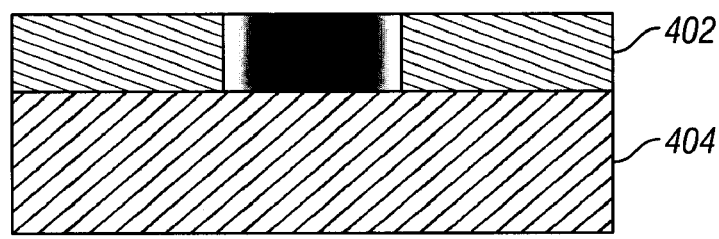
Figure 4C:
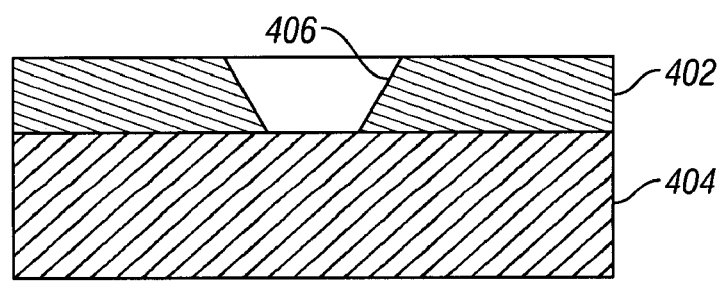
Figure 4D:
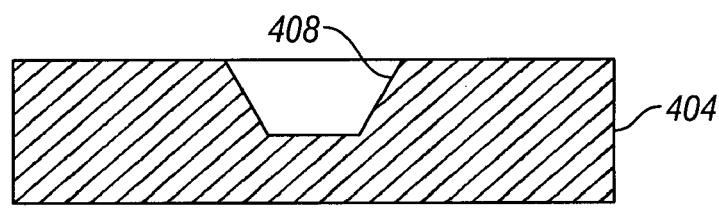

FIGS. 4A-4D show a process flow for producing a PSM including a sloped phase edge architecture. An exposure dose 400 maybe applied to a resistance material 402 on a glass substrate 404, as shown in FIG. 4A. The "slope" of this dose gradient can be adjusted by the degree of defocus applied to the electron beam. The "slope" of the dose gradient may be selected based on the value required to manufacture the slope in the etched glass. The dose gradient creates a slope 406 in the resist 402 under suitable resist development conditions, as shown in FIGS. 4B and 4C. When the resist 402 is etched, the slope 406 is imposed on the final glass profile 408, as shown in FIG. 4D. In the embodiment shown in FIGS. 4A-4D, the glass/resist etch rate is approximately 1:1 such that the glass and resist edge at approximately the same rate. However, other glass/resist etch rates may produce satisfactory results.

In an embodiment, the degree of defocus may be adjusted for individual shot exposures allowing the dose gradient to vary over a large range. For example, the degree of defocus may be adjusted for different figures in the mask. In addition, the defocus may be asymmetric, enabling the dose gradient to be, e.g., steep for vertical edges while gradual for horizontal edges.

The use of sloped phase-edge architecture in the PSM may eliminate the need for a second exposure with a trim mask. Accordingly, alignment problems associated with the second exposure may be avoided. Also, the single exposure process may be more compatible with high speed manufacturing.

Another technique for generating a gradual phase transition is to provide a stepped boundary (e.g., 0°/90°/270° or 0°/60°/120°/180°). However, such stepped boundaries may result in printing out-of-focus and may require a more complex manufacturing process. The embodiments described above may produce a relatively smooth and gradual phase transition which may avoid these problems.

A number of embodiments have been described. Nevertheless, it will be understood that various modifications may be made without departing from the spirit and scope of the invention. Accordingly, other embodiments are within the scope of the following claims.

The invention claimed is:

1. A phase shift mask comprising:
   a plurality of regions having different step heights;
   a first continuous sloped phase edge between first adjacent regions having different step heights, wherein the first continuous sloped phase edge spans a first lateral distance between the first adjacent regions; and
   a second continuous sloped phase edge between second adjacent regions having different step heights, wherein the second continuous sloped phase edge spans a second lateral distance between the second adjacent regions.

2. The phase shift mask of claim 1, wherein:
   the phase shift mask is adapted to expose a substrate using electromagnetic radiation having a wavelength; and
   the first lateral distance is on the order of said wavelength.

3. The phase shift mask of claim 1, wherein the phase shift mask further comprises:
   a third continuous sloped phase edge between third adjacent regions having different step heights, wherein the third continuous sloped phase edge spans a third lateral distance between the third adjacent regions.

4. The phase shift mask of claim 1, wherein the first continuous sloped phase edge is perpendicular to the second continuous sloped phase edge.

5. The phase shift mask of claim 1, wherein the phase shift mask comprises a transmission phase shift mask.

6. The phase shift mask of claim 1, wherein the plurality of regions comprises a plurality of clear regions.

7. The phase shift mask of claim 1, wherein the first adjacent regions having different step heights comprise adjacent 0 and π regions.

8. The phase shift mask of claim 1, wherein:
   the first lateral distance is dimensioned to avoid phase conflict between the first adjacent regions; and
   the second lateral distance is dimensioned to avoid phase conflict between the second adjacent regions.

9. The phase shift mask of claim 1, wherein the first lateral distance differs from the second lateral distance.

10. A method comprising:
    exposing a substrate using a phase shift mask that comprises a pattern comprising a plurality of regions having different step heights, a first continuous sloped phase edge between first adjacent regions having different step heights, and a second continuous sloped phase edge between second adjacent regions having different step heights to image the pattern onto a layer of resist material on the substrate,
    wherein the first continuous sloped phase edge spans a first lateral distance between the first adjacent regions and the second continuous sloped phase edge spans a second lateral distance between the second adjacent regions.

11. The method of claim 10, further comprising:
    developing the resist material without a second exposure.

12. The method of claim 11, wherein the second exposure comprises a trim mask exposure.

13. The method of claim 10, wherein:
    said exposing comprises exposing the substrate using electromagnetic radiation having a wavelength; and
    the first lateral distance is on the order of the wavelength.

14. The method of claim 10, wherein:
    the regions having different step heights comprise clear phase shift regions.

15. The method of claim 10, wherein the first adjacent regions having different step heights comprise adjacent 0 and π regions.

16. The method of claim 10, wherein exposing the substrate using the phase shift mask comprises shifting a phase of light transmitted through the phase shift mask.

17. The method of claim 10, wherein:
    the first lateral distance is dimensioned to avoid phase conflict between the first adjacent regions; and
    the second lateral distance is dimensioned to avoid phase conflict between the second adjacent regions.

18. The method of claim 10, wherein the first lateral distance differs from the second lateral distance.

* * * * *